United States Patent [19]

Haluska et al.

[11] Patent Number: 4,847,162

[45] Date of Patent: Jul. 11, 1989

[54] MULTILAYER CERAMICS COATINGS FROM THE CERAMIFICATION OF HYDROGEN SILSEQUIOXANE RESIN IN THE PRESENCE OF AMMONIA

[75] Inventors: Loren A. Haluska; Keith W. Michael; Leo Tarhay, Midland County, Mich.

[73] Assignee: Dow Corning Corporation, Midland, Mich.

[21] Appl. No.: 138,743

[22] Filed: Dec. 28, 1987

[51] Int. Cl.$^4$ ............................................. B23B 15/04
[52] U.S. Cl. ..................................... 428/457; 427/38; 427/58; 427/99; 427/123; 427/240; 427/249; 427/255.2; 427/255.7; 427/346; 427/404; 427/421; 428/688; 428/704
[58] Field of Search ................ 427/38, 58, 249, 255.2, 427/255.7, 421, 430.1, 346, 240, 99, 123, 404; 428/688, 704, 457

[56] References Cited

U.S. PATENT DOCUMENTS 3,615,272 10/1971 Frye et al.

OTHER PUBLICATIONS

Frye, et al., "The Oligomeric Silsesquoxanes, (HSiO$_{3/2}$)$_n$" (1970), J. Am. Chem. Soc., p. 5586.

Glaser, et al., "Effect of the H$_2$O/Teos Ratio Upon the Preparation and Nitridation of Silica Sol/Gel Films", (1984), J. of Non-crystalline Solids, 63, 209–221.

Brow and Pantano, "Thermochemical Nitridation of Microporous Silica Films in Ammonia", (1987), J. Am. Ceram. Soc., 70, 9–14.

Primary Examiner—Bernard Pianalto
Attorney, Agent, or Firm—James E. Bittell

[57] ABSTRACT

Hydrogen silsesquioxane resin can be ceramified at low temperature in the presence of ammonia, with or without platinum or rhodium catalysis, to form a ceramic coating on the surface of a substrate. The nitrified silica coatings produced are useful as interlevel dielectric films or for planarizing and protecting the surface of electronic devices. For further surface protection, overcoating the nitrided silica with an additional layer of a passivating ceramic material and a top layer of a barrier ceramic material is also described.

28 Claims, No Drawings

MULTILAYER CERAMICS COATINGS FROM THE CERAMIFICATION OF HYDROGEN SILSEQUIOXANE RESIN IN THE PRESENCE OF AMMONIA

BACKGROUND OF THE INVENTION

This invention relates to ceramic coatings for the protection of the surfaces of substrates such as electronic devices like integrated circuits on semiconductor chips. The invention also relates to ceramic coatings used to form interlevel dielectric films to isolate metallization layers in electronic devices.

A common cause of failure of electronic devices is microcracks or voids in the surface passivation of the semiconductor chip allowing the introduction of impurities. Thus a need exists for improved protective coatings which will resist the formation of microcracks, voids or pinholes even during use in stressful environments.

Passivating coatings on electronic devices can provide barriers against ionic impurities, such as chloride ion ($Cl^-$) and sodium ion ($Na^+$), which can enter an electronic device and disrupt the transmission of electronic signals. The passivating coating can also be applied to electronic devices to provide some protection against moisture and volatile organic chemicals.

Frye and Collins teach in U.S. Pat. No. 3,615,272, issued Oct. 26, 1971, and also in Frye, et al., J. Am. Chem. Soc., 92, p. 5586, 1970, the formation of hydrogen silsesquioxane resin.

Glaser et al. ("Effect of the $H_2O$/TEOS Ratio Upon The Preparation And Nitridation Of Silica Sol/Gel Films", Journal of Non-Crystalline Solids 63, (1984) p. 209–221) utilized solutions of hydrolyzed tetraethoxysilane (TEOS), and not hydrogen silsesquioxane resin, to produce silica sol/gel films which were subsequently subjected to thermal treatment and nitridation in an ammonia atmosphere. Glaser et al. suggests that the nitrided silican sol/gel films may be useful oxidation barriers for silicon and other metal surfaces.

Brow and Pantano, Journal of the American Ceramic society, 70(1) pp. 9–14, 1987, discloses the thermochemical nitridation of microporous silica films in ammonia using so-called "sol gels" derived from tetraethoxysilane as the starting material. Brow and Pantano does not teach the use of hydrogen silsesquioxane resin as the starting material, nor does it teach the low temperature process claimed herein.

The inventors have recently filed several patent applications on inventions related to the formation of ceramic coatings for the protection of electronic devices. These patent applications include: Ser. No. 938,679, titled "Multilayer Ceramics From Silicate Esters", filed Dec. 4, 1986 in the names of Loren Haluska, Keith Michael, and Leo Tarhay; Ser. No. 937,274, titled "Multilayer Ceramics From Hydrogen Silsesquioxane", filed Dec. 3, 1986 in the names of Loren Haluska, Keith Michael, and Leo Tarhay; Ser. No. 937,276, titled "SiN-containing Coatings For Electronic Devices", filed Dec. 3, 1986 in the names of Ronald Baney, Loren Haluska, Keith Michael, Sarah Snow, and Leo Tarhay; Ser. No. 937,273 titled "Platinum and Rhodium Catalysis of Low Temperature Formation Multilayer Ceramics", filed on Dec. 3, 1986 in the names of Loren Haluska, Keith Michael, and Leo Tarhay; Ser. No. 000,217, titled "Multilayer Ceramic Coatings From Silicate Esters and Metal Oxides", filed on Jan. 2, 1987 in the names of Loren Haluska, Keith Michael, and Leo Tarhay; Ser. No. 938,678, titled "Platinum or Rhodium Catalyzed Multilayer Ceramic Coatings From Hydrogen Silsesquioxane Resin and Metal Oxides", filed on Dec. 4, 1986 in the names of Loren Haluska, Keith Michael, and Leo Tarhay; and Ser. No. 938,677, titled "Multilayer Ceramic Coatings From Metal Oxides for Protection of Electronic Devices", filed on Dec. 4 1986, in the names of Loren Haluska, Keith Michael, and Leo Tarhay, all of which applications are incorporated by reference.

SUMMARY OF THE INVENTION

The instant invention relates, in one embodiment, to a process for the low temperature formation of monolayer and/or multilayer coatings for the protection of surface features of sensitive substrates such as electronic devices. In a second embodiment the invention relates to the formation of interlevel dielectric films as used in electronic devices where electronic functions are built up and occur in multiple metallized layers separated electrically by interlevel dielectric films. The coating methods of this invention are especially effective in providing protection for surfaces having irregular features such as a CMOS device having bond pad attachments and an etch pattern.

In the present invention, a method is described for forming a planarizing first layer of nitrided silicon dioxide on a substrate surface. The coating of nitrided silicon dioxide provides substantial surface protection as a monolayer and can be used independent of other overcoat layers or can be used as the first layer of a multilayer protective coating system. Alternatively, a nitrided silicon dioxide coating provides a dielectric film which, after overcoating with a metallization layer, functions as an interlevel dielectric layer. Nitrided silicon dioxide coatings are obtained according to the present invention by first applying a solution of hydrogen silsesquioxane resin $(HSiO_{3/2})_n$, with or without platinum or rhodium catalysts, to the surface of a substrate and then heat treating the coating in an ammonia atmosphere to effect conversion to the nitrided silicon dioxide.

The dual-layer coatings of the present invention consist of (1) a first layer of nitrided $SiO_2$ planarizing coating as described above, and (2) a second coating layer of silicon, silicon-nitrogen, silicon-carbon, or silicon-carbon-nitrogen ceramic or ceramic-like material as further described hereafter. The second layer is formed over the first coating layer by either of two methods. In one option, the second coating layer is formed by applying a preceramic polymer over the surface of the first layer, typically using a conventional flow coating technique with the preceramic polymer dissolved in a solvent which subsequently evaporates. The polymer coating is then converted to a ceramic or ceramic-like layer by a subsequent heat treatment. Alternatively, the second layer can be a silicon, silicon-nitrogen, silicon-carbon-nitrogen, or silicon-carbon ceramic layer deposited directly by a chemical vapor deposition process.

The instant invention also relates to the formation of a three layer coating system for the protection of electronic devices wherein the first layer is a nitrided $SiO_2$ planarizing coating as described above and the second layer is any of the ceramic coatings described above. The third layer in the three layer coatings of the present invention is a top coating of (a) silicon ceramic material applied by CVD, PECVD, or metal assisted CVD of a silane, halosilane, halodisilane, polyhalosilane, or mixtures thereof, or (b) silicon-carbon ceramic material, applied by CVD or plasma enhanced CVD of a silane, halosilane, halodisilane, polyhalosilane, or mixtures thereof, and an alkane of one to six carbon atoms, or an alkylsilane, or (c) silicon-nitrogen ceramic material applied by CVD or plasma enhanced CVD of a silane, halosilane, halodisilane, polyhalosilane, or mixtures thereof, and ammonia, or (d) silicon-carbon-nitrogen ceramic material applied by CVD or plasma enhanced CVD of hexamethyldisilazane or CVD or plasma enhanced CVD of a mixture of silane, alkane and ammonia or a mixture of alkylsilane and ammonia.

DETAILED DESCRIPTION OF THE INVENTION

The instant invention relates to the discovery that nitrided silicon dioxide ceramic coatings, derived from the ceramification of a hydrogen silsesquioxane resis $(HSiO_{3/2})_n$, with or without platinum or rhodium catalysis, in an ammonia atmosphere, can be applied onto substrates, including, but not limited to, electronic devices and integrated circuits, to provide protection of the substrates from the environment.

In the instant invention, the term "ceramic" is intended to designate both conventional ceramic materials and other heat treated or pyrolyzed materials which have been substantially altered in chemical composition and physical characteristics by the heat treatment, but which may not be fully free of residual hydrogen and/or other elements representative of the materials preceramic structure. The term "electronic device" in the instant invention is intended to include, but not be limited to, electronic devices, silicon based devices, gallium arsenide devices, focal plane arrays, opto-electronic devices, photovoltaic cells, optical devices, interlevel dielectric layers, doped dielectric layers to produce transistor-like devices, multilayer devices, 3-D devices, silicon-on-insulator (SOI) devices, super lattice devices and the like. The phrase "flowable solution comprising hydrogen silsesquioxane resin" in the present invention should be understood to mean flowable, extrudable or pourable organic solvent solutions of the catalyzed or uncatalyzed hydrogen silsesquioxane resin. The term "cure" in the present invention is intended to mean co-reaction and ceramification or partial ceramification of the starting material by heating to such an extent that a solid ceramic coating material is produced. The phrase "nitrided silicon dioxide" in the present invention is intended to mean silicon and oxygen containing materials which also have therein nitrogen. Nitrogen incorporation was found to occur in the process of the present invention. Thus, silicon oxynitrides are envisioned as possible materials to be found within the scope of the "nitrided silicon dioxide" materials discussed herein.

The instant invention relates to enhanced protection of substrates such as electronic devices by the low temperature formation of thin monolayer or multilayer ceramic coatings on the surface of the substrates. According to the present invention, the electronic device is first coated with a solution of hydrogen silsesquioxane resin, $(HSiO_{3/2})_n$ wherein n is an integer indicating the degree of polymerization and typically varies from about 10 to about 1000. For example, hydrogen silsesquioxane resins having a weight average molecular weight varying from about 8,000 to about 28,000 and corresponding number average molecular weights of about 800 to about 2900, have been found useful in the practice of this invention. Hydrogen silsesquioxane resin is a known material which can be prepared by the method described in U.S. Pat. No. 3,615,272 which is hereby incorporated by reference.

The hydrogen silsesquioxane resin is diluted in a solvent to facilitate coating the substrate. It is generally preferred to dilute the resin with a solvent such as n-heptane or toluene to about 0.1 to about 85 percent solids by weight. One advantage of the hydrogen silsesquioxane resin, especially in regard to coating sensitive electronic devices, is that is is prepared from carbon free trihalosilane monomers so that the potential for carbon contaminants in coatings derived from it is minimized.

The hydrogen silsesquioxane resin can be coated on substrates and cured without the presence of any catalyst. However, the inclusion of platinum catalysts, such as, for example, $[(CH_3CH_2)_2S]_2PtCl_2$, and $Pt[OC(CH_3)=CHC(O)CH_3]_2$, or rhodium catalyst, such as $RhCl_3[(CH_3CH_2CH_2CH_2)_2S]_3$, in the resin enhances the oxidation and cure of the $(HSiO_{3/2})_n$ coating. The platinum catalysts and rhodium catalysts operative in the present invention include, but are not limited to, $[(CH_3CH_2)_2S]_2PtCl_2$, platinum acetylacetonate, and rhodium catalyst $RhCl_3[(CH_3CH_2CH_2CH_2)_2S]_3$, obtained from Dow Corning Corporation, Midland, MI. Any platinum or rhodium compound or complex which can be solubilized in the hydrogen silsesquioxane resin will serve to catalyze the cure and is within the scope of this patent.

Generally, the amount of platinum or rhodium catalyst used can be varied widely, however, it is usually preferred to use sufficient catalyst compound to provide 2 ppm to 1000 ppm of the metal based on the amount of resin in the composition. It is even more preferred to use appropriate levels of catalyst compound to provide 15 to 60 ppm of the metal. The platinum or rhodium catalyst can be added to the solution of hydrogen silsesquioxane resin in an amount of, for example 60 parts per million of platinum as $[(CH_3CH_2)_2S]_2PtCl_2$. The platinum and/or rhodium catalysts also assist in the reduction or elimination of residual SiH and SiOH functionality on the $(HSiO_{3/2})_n$ resin during subsequent cure and thereby increase the production of $SiO_2$.

Furthermore, the presence of catalysts in the hydrogen silsesquioxane resin significantly reduces the weight loss observed during heat treatment in the ammonia atmosphere. For example, a 6% reduction in weight during heat treatment was observed when a platinum catalyst was used in the resin. It is believed this low degree of weight loss is indicative of improved cross linking of the resin to form higher molecular weight polymers with higher char yields, a feature important in ceramification. Furthermore, other ceramification experiments run in ammonia on the uncatalyzed and platinum catalyzed silsesquioxane resin demonstrate a 28% weight loss in the former but only a 4.6% weight loss in the latter. The higher ceramic char yields obtained with the catalyzed resins are an important advantage of one embodiment of the present invention.

The catalyzed or uncatalyzed hydrogen silsesquioxane resin solution is coated onto an electronic device and the solvent allowed to evaporate by drying at ambient or elevated temperatures. The process of coating the resin mixture onto the electronic device can be, but is not limited to, spin coating, dip coating, spray coating, or flow coating with spin coating usually preferred.

The polymer coating is then cured and ceramified by heating the coated device, for example, for approximately one hour at 400° C. in an ammonia atmosphere. Generally, it is preferred to effect the heat treatment in an atmosphere of anhydrous ammonia that is essentially free of other components. The use of such an atmosphere improves the effectiveness of the ammonia and extent of nitridation that is obtained at a given temperature and time of treatment. It should be understood however that lesser amounts of ammonia such as less than atmospheric pressures of ammonia or mixtures of ammonia and other non-interfering gaseous components can be used in the process of the present invention. Of course, pressures of ammonia above atmospheric may also be used so long as the ammonia remains in the gaseous state. Any gaseous atmosphere containing sufficient ammonia to effect nitridation of the coating during the heat treatment can be used in the present invention. For the purposes of this invention an atmosphere containing sufficient ammonia to effect nitridation during heat treatment will be referred to as a "substantially ammonia" atmosphere.

Continuous, crack-free films of nitrided metal oxide ceramic are formed on the surface of substrates by the procedures of this invention. The films can be formed up to about 2 microns thickness without observable cracks or defects. Typically, it is preferred when coating electronic circuits to use films of about 0.3 to 0.5 microns thickness. Such films are preferred because they minimize the possibility of cracking and defects resulting from thermal stresses, but have sufficient thickness to provide substantial planarizing or smoothing of the irregular features on the surface of electronic circuits. This smoothing or planarizing effect is needed so that subsequent coatings of other components can be applied which are not typically useful on highly irregular surfaces.

The smoothing effect on this layer tends to minimize the mechanical stresses caused by irregular topography often found on the surface of such substrates as integrated circuit devices. By minimizing such stresses, microcracking of a subsequently applied passivation coating layer is reduced or eliminated under thermal cycling conditions and the life of the integrated circuit device is increased.

An important feature of the present invention is the utilization of ammonia in the pyrolytic elimination of SiH and SiOH during the heat treatment of the hydrogen silsesquioxane coatings. This heat treatment in an ammonia atmosphere produces coatings essentially free of SiH and SiOH. Infrared analyses of coatings prepared on potassium bromide crystal plates by pyrolysis of hydrogen silsesquioxane resin in ammonia indicated an improved efficiency and effectiveness in the removal of residual SiH and SiOH moieties in comparison to similar coatings pyrolyzed in air. The addition of ammonia is believed to create an atmosphere more reactive than air toward the pyrolytic elimination of SiH and SiOH.

Furthermore, by pyrolyzing the catalyzed or uncatalyzed hydrogen silsesquioxane resin in ammonia, nitrogen is incorporated into the ceramic or ceramic-like silicon dioxide coating. The nitridation in the process of the present invention resulted in approximately 1 to 2 weight percent nitrogen incorporation. It is believed that nitrogen incorporation may result from formation of silicon oxynitride as a component of the coating.

An advantage of the process of the present invention over the state-of-the-art processes is the ability of the hydrogen silsesquioxane coatings to be cured by heat treatment in the presence of ammonia at temperatures as low as 200° to 400° C. This temperature range is significantly lower than that of the prior art. Thus a preferred embodiment of the process of the present invention is the pyrolysis of the $(HSiO_{3/2})_n$ resin coating in an ammonia atmosphere at a temperature between 200° and 1000° C. A more preferred embodiment of the process of the present invention is the pyrolysis of the $(HSiO_{3/2})_n$ resin coating in an ammonia atmosphere at a temperature in the range from 200° up to and including 400° C.

The present invention further relates to a process for forming on a substrate a ceramic coating which process comprises: (A) applying a flowable solution of hydrogen silsesquioxane resin to the substrate; (B) drying the resin solution to deposit a $(HSiO_{3/2})_n$ coating on the substrate; and, (C) heating the coated substrate in a substantially ammonia atmosphere to a temperature sufficient to produce a ceramic coating on the substrate. The phrase "drying the resin solution" herein means evaporation of the organic solvent in the flowable solution of hydrogen silsesquioxane resin.

The choice of substrates to be coated by the instant invention is limited only by the need for thermal and chemical stability of the substrate.

The instant invention further relates to the discovery that these nitrided silicon dioxide ceramic coatings can be coated with various silicon, silicon-carbon, silicon-nitrogen, or silicon-carbon-nitrogen containing materials for the still further protection of sensitive substrates such as electronic devices or integrated circuits. Correspondingly, the instant invention also relates to a process for forming on a substrate a multilayer, ceramic coating which process comprises applying a second passivating coating to a substrate previously coated with the ceramified hydrogen silsesquioxane resin. The passivation layer prevents ionic impurities from entering the electric field of coated substrates such as an integrated circuit device.

The passivating coating may comprise, for example, a ceramic film produced by diluting a preceramic polymer in a solvent, coating the device with the diluted preceramic polymer solution, drying the diluted preceramic polymer solution so as to evaporate the solvent and thereby deposit a coating of the preceramic polymer on the device, and heating the coated device in an inert or ammonia containing atmosphere to a temperature sufficient to ceramify the second coating on the device.

Any preceramic polymer can be used to prepare a passivating layer as described above so long as the polymer can be dissolved in a solvent suitable for use as a coating medium. Suitable preceramic polymers include, for example, polymers which are known precursors for silicon-carbide ceramic material such as polycarbosilanes and organopolysilanes. The polycarbosilanes can be prepared by thermolysis of polydimethylsilanes, thermolysis of organosilane monomers, or potassium-dechlorination of chloromethyl- or vinylsilanes with other methylchlorosilanes. The polycarbosilanes and their preparations are further described in U.S. Pat. Nos. 4,052,430, 4,414,403, 4,497,787, and 4,472,591 and Ger. Offen. No. 2,236,078 which are hereby incorporated by reference. The organopolysilanes can be prepared by sodium-dechlorination of di(mixed-organo)dichlorosilanes or by redistribution of methylchlorodisilanes. The organopolysilanes, various derivatives of organopolysilanes, and preparations are further described in U.S. Pat. Nos. 4,260,780, 4,324,901, 3,310,651, 4,310,482, 4,298,559, 4,546,163, 4,298,558, 4,310,481, and 4,314,956 which are hereby incorporated by reference.

Other suitable preceramic polymers include, for example, polymers which are known precursors for silicon-nitride ceramic material such as polysilazanes prepared by ammonolysis of dichlorosilane as described by Seyferth et al. in U.S. Pat. No. 4,397,828 which is hereby incorporated by reference.

Still other suitable preceramic polymers include, for example, polymers which are known precursors for silicon-carbon-nitrogen ceramic material such as silsesquiazanes and carbon substituted polysilazanes. Silsesquiazanes can be prepared by ammonolysis of organotrichlorosilane, aminolysis of $CH_3SiCl_3$ and $SiCl_4$, and silazanolysis of $CH_3SiCl_3$ and $HSiCl_3$. Carbon substituted polysilazanes can be prepared by ammonolysis of $CH_3HSiCl_2$ or methylchlorodisilanes, by aminolysis of $H_2SiCl_2$, by thermal redistribution of methylchlordisilanes with hexamethyldisilazane, or by thermal redistribution of trichlorosilane with hexaorganodisilazane or cyclic organosilazanes. The silsesquiazanes and carbon substituted polysilazanes are known materials which are further described in U.S. Pat. Nos. 3,892,583, 3,853,567, 4,312,970, 4,482,669, 4,395,460, 4,340,619, 4,482,689, 4,543,344, and 4,540,803 which are hereby incorporated by reference.

Polysilacyclobutasilazanes are also useful as ceramic precursor polymers for formation of a passivation coating layer. Polysilacyclobutasilazanes are prepared by reacting 1,1-dichloro-1-silacyclobutane with a difunctional nucleophile such as ammonia, hydrazine, or a diamine. An especially preferred polymer is prepared by reacting 1,1-dichloro-1-silacyclobutane with ethylenediamine in methylene chloride (solvent) in the presence of triethylamine (acid acceptor).

The formation of a passivating coating layer is specifically exemplified as follows for a preferred embodiment wherein a polysilazane prepared by the method described in U.S. Pat. No. 4,540,803 is used as the precursor for formation of a silicon-carbon-nitrogen ceramic layer. The preceramic polymer is diluted (e.g., 0.1 to 50 weight percent) in an organic solvent such as toluene or n-heptane. The polymer solution is coated (by any convenient method such as spin coating) onto an electronic device over the previously applied planarizing coating of nitrided silica material. The solvent is allowed to evaporate by drying in an inert or ammonia containing atmosphere. The preceramic polymer coating is then ceramified by heating the coated device for approximately one hour at temperatures up to 400° C. under argon. Thin ceramic passivating coatings of less than 2 microns (preferrably approximately 0.3 to 0.5 microns) are thus produced on devices.

The preferred temperature range for ceramifying or partially ceramifying preceramic polymer is from 200° to 400° C. A more preferred temperature range for ceramifying preceramic polymer is from 300° to 400° C. The method of applying the heat for the ceramification or partial ceramification of the preceramic coating is not limited to conventional thermal methods. Also, the present invention is not limited to ceramification temperatures below 400° C. Ceramification techniques utilizing temperatures up to and including at least 1000° C. will be obvious to those skilled in the art, and are useful in the present invention where the substrate can withstand such temperatures.

The second or passivating coating may also comprise a CVD or PECVD applied silicon containing coating, silicon-carbon containing coating, silicon-nitrogen containing coating or silicon-carbon-nitrogen containing coating, or a combination of these coatings. A material composed primarily of silicon can be deposited by the CVD or plasma enhanced CVD of silane, halosilanes, polyhalosilanes, or halodisilanes. Silicon-nitrogen containing material can be deposited by the CVD or plasma enhanced CVD of a silazane or cyclosilazane $(H_2SiNH)_x$, by the CVD or plasma enhanced CVD of either carbosilazane or polysilacyclobutasilazane combined with ammonia, or by the CVD or plasma enhanced CVD of the products formed by reacting either silane, halosilanes, polyhalosilanes, or halodisilanes with ammonia. Silicon-carbon containing material can be deposited by the CVD or plasma enhanced CVD of the products formed by reacting either silane, halosilanes, polyhalosilanes, or halodisilanes with an alkane of one to six carbon atoms. Silicon-carbon-nitrogen containing material can be deposited by the CVD or PECVD of either hexamethyldisilazane or carbosilazane in an ammonia atmosphere, by the CVD or PECVD of cyclosilazane, silazanes, or the CVD or PECVD of mixtures of either a silane or an alkylsilane with an alkane of one to six carbon atoms, and ammonia.

For the still further protection of sensitive substrates such as electronic devices or integrated circuits, it may also be advantageous to apply a barrier coating over the top of the planarizing and/or passivating coating layers of this invention. The barrier coating layer is intended to hermetically seal the substrate surface from all external influences including any form of water, organic vapor, and ionic impurities. Preferred components for use in fashioning the barrier layer include dense amorphous silicon, silicon carbide, silicon nitride, and silicon-carbon-nitrogen ceramic materials, with dense amorphous silicon being most preferred.

The barrier coating is generally applied by a CVD or plasma enhanced CVD process. Barrier coatings can be applied by any of the CVD or plasma enhanced CVD processes previously described above for application of the passivation coating layer. However, it is preferred to form a silicon containing third layer or topcoat at a relatively low reaction temperature by the metal-assisted CVD process claimed in the co-pending U.S. patent application, Ser. No. 835,029, mentioned supra. The metal assisted CVD process is particularly suited for the deposition of coatings from $SiCl_4$, $SiBr_4$, $HSiI_3$, $HSiCl_3$, and $HSiBr_3$.

Single layer or multilayer coatings produced by the instant invention possess low defect density and are useful on electronic devices as protective coatings, as corrosion resistant and abrasion resistant coatings, as temperature and moisture resistant coatings, and as a diffusion barrier against ionic impurities such as $Na^+$ and $Cl^-$. The coatings of the present invention are also useful for functional purposes in addition to protection of electronic devices from the environment. The coatings of the present invention are useful, for example, as interlevel dielectric layers, multilayer devices, 3-D devices, compact discs, optical discs, optically readable devices and surfaces, silicon-on-insulator (SOI) devices, superconducting devices, and super lattice devices. More specifically, the nitrided silica ceramic coatings of the instant invention are useful as interlevel dielectrics within the body of the electronic device and between the metallization layers.

Another unique aspect of the coatings produced by the present invention is their transparency to electromagnetic radiation. Thus a particular advantage of the coatings of the present invention is utilization on focal plane arrays, photovoltaic cells, or opto-electronic devices in which electromagnetic radiation can pass into or emanate from the coated device.

The following examples are presented to illustrate the invention to those skilled in the art and should not be construed as limiting the invention, which is properly delineated in the appended claims. All proportions by parts or percents are by weight unless otherwise stated.

EXAMPLE 1

Ceramification at 400° C. in ammonia

Hydrogen silsesquioxane resin produced by the method of Frye, et al. U.S. Pat. No. 3,615,272, issued Oct. 26, 1971, was diluted to low solids, 0.75%, in n-heptane. Five (5) drops of the preceramic polymer solution was then placed on a Motorola 14011B CMOS device and spin coated at about 1700 rpm for 30 seconds. A 2 inch Lindberg furnace was flushed with anhydrous ammonia gas for 20 minutes to provide an ammonia atmosphere essentially free of other components. The hydrogen silsesquioxane resin was then ceramified by heating the coated device in the ammonia atmosphere in the Lindberg furnace to 400° C. for sixty minutes to form a nitrided silica coating on the device. Examination of the coated device showed the coating was of good optical quality. The coated device passed the go/no go test on the Teradyne Analogical Circuit Test Instrument J133C equipped with a CMOS 4000 AE Series Family Board and a CMOS 4011 A Quad 2 Input Nand Gate Device Board. The hydrogen silsesquioxane resin, above, was evaluated for % nitridation by curing 0.5 g of the resin in an ammonia atmosphere at 400° C. for two hours. The weight of the product after heating in ammonia was 0.36 g, a 72% char yield. Analysis of the product showed 1.66% nitrogen, 0.44% hydrogen and 0.64% carbon in the cured material. The carbon is believed to result from inadvertent minor amounts of organic contaminants.

EXAMPLE 2

Platinum Catalyzed Ammonia Pyrolyzed Planarizing Coating

Hydrogen silsesquioxane resin, $(HSiO_{3/2})_n$, prepared as in Example 1, was diluted to low solids, 0.75%, in n-heptane. The hydrogen silsesquioxane resin solution (10 ml) was catalyzed with 0.01 g of toluene in which was dissolved 17 ppm based on resin solids of platinum as $[(CH_3CH_2)_2S]_2PtCl_2$. The catalyzed preceramic polymer solvent solution was then applied to a Motorola 14011B CMOS electronic device by applying 5 drops of the solution on the device and spinning the device at approximately 1700 rpm for 30 seconds. The deposited coating was ceramified by heating the coated device in ammonia as described in Example 1 for approximately one hour at 400° C. A thin ceramic planarizing coating was produced on the device. After pyrolysis, examination of the coated device at 40×magnification showed the coating was of good optical quality with no coating cracks or defects. The coated device passed the go/no go test on the Teradyne Analogical Circuit Test Instrument J133C equipped with a CMOS 4000 AE Series Family Board and a CMOS 4011 A Quad 2 Input Nand Gate Device Board.

EXAMPLE 3

Nitridation of $HSiO_{3/2}$ Resin

Hydrogen silsesquioxane resin (0.283 g) and platinum catalyst (0.05 g of toluene in which was dissolved 60 ppm based on resin of platinum as $Pt[OC(CH_3)=CHC(O)CH_3]_2$, were ceramified in an ammonia atmosphere as described in Example 1 for 2 hours at 400° C. The resulting product weighed 0.270g (95.4% yield) and had an elemental analysis of 2.71% nitrogen.

The surface of a 1 inch molybdenum square was flow coated with 4 drops of an n-heptane solution of 2% hydrogen silsesquioxane resin and 60 ppm, based on resin, of platinum as $Pt[OC(CH_3)=CHC(O)CH_3]_2$. The coating was air dried for 30 minutes and then ceramified by heating in an ammonia atmosphere at 400° C. for 2 hours and 23 minutes.

The coating, was subjected to electron spectroscopy for chemical analysis (ESCA). The following results were obtained:

| Element | Surface, % | 100 Angstroms depth, % |
|---------|------------|------------------------|
| N       | 1.3        | 1.2                    |
| Si      | 28.5       | 32.8                   |
| O       | 61.7       | 64.3                   |
| C       | 8.5        | 1.7                    |

EXAMPLE 4

Rhodium Catalyzed Ammonia Pyrolysis of $HSiO_{3/2}$ Resin

Hydrogen silsesquioxane resin was diluted to low solids, 1%, in n-heptane. The resin solution (10 ml) was catalyzed by adding 0.005 g of 0.5% solution in toluene of rhodium catalyst $RhCl_3[(CH_3CH_2CH_2CH_2)_2S]_3$, obtained from Dow Corning Corporation, Midland, MI. The catalyzed solution was then spin coated onto a Motorola 14011B CMOS electronic device by the method of Example 2. The catalyzed hydrogen silsesquioxane resin was then ceramified by heating the coated device in ammonia as described in Example 1 in a 2 inch Lindberg furnace to 400° C. for 3 hours and 28 minutes to form a nitrided silica coating on the device. The coated device passed the go/no go test on the Teradyne Analogical Circuit Test Instrument J133C equipped with a CMOS 4000 AE Series Family Board and a CMOS 4011 A Quad 2 Input Nand Gate Device Board.

EXAMPLE 5

Ceramification of Silazane Polymer Passivating Coating

When preceramic silazane polymer, prepared by the method of Cannady in Example 1 in U.S. Pat. No. 4,540,803, is diluted to 1.0% in toluene, it can be spin coated onto the coated electronic devices of Examples 1 and 2 and the solvent can be allowed to evaporate by drying in the absence of air. The deposited coating should be ceramified by heating the coated device for approximately one hour at 400° C. under argon. A thin silicon-nitrogen-carbon containing ceramic passivating coating will be produced on the coated device.

This example can be repeated with the exception of ceramifying the preceramic polymer coating by heating the coated device for approximately one hour at temperatures up to 400° C. under ammonia rather than argon. No adverse effects on the coating or the device will be noted.

EXAMPLE 6

Ceramification of Silazane Polymer and Titanium Passivating Coating

A preceramic silazane polymer containing about 5% titanium, prepared by the method of Haluska in Example 13 in U.S. Pat. No. 4,482,689, can be spin coated onto the nitrided silica coated electronic devices from Examples 1 and 2 above, and the solvent can be allowed to evaporate by drying. The deposited coating can be ceramified by heating the coated device for approximately one hour at temperatures up to 400° C. under argon. A thin silicon-nitrogen ceramic coating will be produced on the device.

EXAMPLE 7

Ceramification of Silazane polymer passivating coating

A preceramic silazane polymer, prepared by the method of Gaul in Example 1 in U.S. Pat. No. 4,395,460, can be spin coated onto the nitrided silica coated electronic devices produced by the method of Examples 1 and 2 and the solvent can be allowed to evaporate. The deposited coating can be ceramified by heating the coated devices for approximately one hour at temperatures up to 400° C. under argon. A thin silicon-nitrogen containing ceramic passivating coating will be produced on the device.

This example can be repeated with the exception of ceramifying the preceramic polymer coating by heating the coated devices for approximately one hour at temperatures up to 400° C. under ammonia rather than argon. No adverse effects on the coating or the devices will be noted.

EXAMPLE 8

Ceramification of silazane polymer passivating coating

A 1-2% solution in diethyl ether of dihydridosilazane polymer, prepared by the method of Seyferth in Example 1 in U.S. Pat. No. 4,397,828, can be flow coated onto a Motorola 14011B CMOS electronic device previously coated by the method of Example 1. The coated device can be heated in nitrogen for one hour at 400° C. The coating and pyrolysis treatment will not adversely affect the device function, as can be determined by a CMOS circuit tester. The coated device will withstand 0.1 M NaCl exposure for over four hours before circuit failure. A non-protected CMOS device will fail to function after exposure to a 0.1 M NaCl solution for less than one minute.

This example can be repeated with the exception of ceramifying the preceramic dihydridosilazane polymer coating by heating the coated device for approximately one hour at 400° C. under ammonia rather than nitrogen. No adverse effects on the coating or the device will be noted.

EXAMPLE 9

CVD barrier coat from $F_3SiSiF_3$

The electronic devices coated with the planarizing and/or passivating coatings of Examples 1 through 6 can be overcoated with a barrier coat as follows; hexafluorodisilane, 50 Torr, can be placed in a previously evacuated Pyrex ® glass container along with Motorola 14011B CMOS electronic devices, previously coated as described in Examples 1 through 6. The hexafluorodisilane should be transferred to the glass container in such a manner as to preclude exposure to the atmosphere. The container should be heated in an oven for 30 minutes at a temperature of approximately 360° C. During this time the hexafluorodisilane starting material will decompose and form a silicon topcoat on the previously coated electronic devices. The by-products, mixtures of various halosilanes, and any unreacted starting material can be removed by evacuation after the container has been reattached to a vacuum line. The ceramic coated electronic device, onto which the decomposed hexafluorodisilane starting material deposits a silicon topcoating, can then be removed. The coated devices will pass the go/no go test on the Teradyne Analogical Circuit Test Instrument J133C equipped with a CMOS 4000 AE Series Family Board and a CMOS 4011 A Quad 2 Input Nand Gate Device Board.

EXAMPLE 10

PECVD barrier coat from $H_2SiF_2$

Using plasma enchanced chemical vapor deposition techniques, difluorosilane can be decomposed at 400° C. in the presence of previously coated electronic devices prepared by the methods of Examples 1-6. When devices previously coated as described in Example 1-4 are coated in this manner, electronic devices are produced which are protected by a first layer of a planarizing coating of nitrided silica ceramic material and a second layer of a passivating coating of silicon and nitrogen containing ceramic material. When devices previously coated as described in Example 5 are coated in this manner, electronic devices are produced which are protected by a first layer of a planarizing coating of nitrated silica ceramic material, a second layer of a passivating coating of silicon and nitrogen containing ceramic material, and finally a third layer of a barrier coating of PECVD-applied amorphous silicon containing material. The coated devices will pass the go/no go test on the Teradyne Analogical Circuit Test Instrument J133C equipped with a CMOS 4000 Series Family Board and a CMOS 4011 A Quad 2 Input Nand Gate Device Board.

Devices coated with one, two, three, or more layer coatings are expected to be useful in a variety of applications with the optimum number of coating layers depending on the harshness of the particular environment of use.

That which is claimed is:

1. A process for forming on a substrate a ceramic coating which process comprises:
  (A) applying a flowable solution comprising hydrogen silsesquioxane resin to the substrate;
  (B) drying the resin solution to deposit a hydrogen silsesquioxane resin on the substrate; and, (C) heating the coated substrate in a substantially ammonia atmosphere to a temperature sufficient to produce a ceramic coating on the substrate.

2. A process as claimed in claim 1 further comprising: (D) applying to the ceramic coating a passivating coating selected from the group consisting of (i) a silicon coating, (ii) a silicon-carbon coating, (iii) a silicon-nitrogen coating, and (iv) a silicon-carbon-nitrogen coating, wherein the passivating coating is applied by a means selected from the group consisting of (a) chemical vapor deposition, (b) plasma enhanced chemical vapor deposition, and (c) application of a preceramic polymer coating and subsequent ceramification of the preceramic polymer coating.

3. A process as claimed in claim 2 further comprising: (E) applying to the passivating coating a barrier coating selected from the group consisting of (i) a silicon coating, (ii) a silicon-carbon coating, (iii) a silicon-nitrogen coating, (iv) a silicon-carbon-nitrogen coating, wherein the barrier coating is applied by a means selected from the group consisting of (a) chemical vapor deposition and (b) plasma enhanced chemical vapor deposition.

4. A process as claimed in claim 3 wherein the barrier coating is applied by means of metal assisted chemical vapor deposition.

5. An article comprising a structure having thereon a coating formed by the process of claim 3.

6. An article comprising an electronic device having thereon a coating formed by the process of claim 3.

7. A process as claimed in claim 2 wherein the passivating coating is applied by means of metal assisted chemical vapor deposition.

8. a process as claimed in claim 2 wherein the passivating coating is applied by means of application of a preceramic polymer coating and subsequent ceramification of the preceramic polymer coating wherein the preceramic polymer is a polysilacyclobutasilazane.

9. A process as claimed in claim 8 wherein the polysilacyclobutasilazane is prepared by reacting 1,1-dichloro-1-silacyclobutane with ethylenediamine.

10. An article comprising a structure having thereon a coating formed by the process of claim 9.

11. An article comprising an electronic device having thereon a coating formed by the process of claim 9.

12. An article comprising a structure having thereon a coating formed by the process of claim 8.

13. An article comprising an electronic device having thereon a coating formed by the process of claim 8.

14. An article comprising a structure having thereon a coating formed by the process of claim 2.

15. An article comprising an electronic device having thereon a coating formed by the process of claim 2.

16. A process as claimed in claim 1 wherein the flowable solution comprising hydrogen silsesquioxane is catalyzed with platinum catalyst.

17. An article comprising a structure having thereon a coating formed by the process of claim 4.

18. An article comprising an electronic device having thereon a coating formed by the process of claim 16.

19. An article comprising an electronic device containing multiple layers of metalization and an interlevel layer which isolates electronic functions occurring in the metalization layers, the interlevel layer having been formed by the process of claim 16.

20. A process as claimed in claim 1 wherein the flowable solution comprising hydrogen silsesquioxane is catalyzed with rhodium catalyst.

21. An article comprising a structure having thereon a coating formed by the process of claim 5.

22. An article comprising an electronic device having thereon a coating formed by the process of claim 20.

23. A process as claimed in claim 1 wherein the temperature is 200° to 1000° C.

24. A process as claimed in claim 1 wherein the ceramification temperature is 200° to 400° C. and the substrate is an electronic device.

25. A process as claimed in claim 1 wherein a method of applying the flowable solution onto the substrate is selected from the group consisting of spray coating, dip coating, flow coating and spin coating.

26. An article comprising a structure having thereon a coating formed by the process of claim 1.

27. An article comprising an electronic device having thereon a coating formed by the process of claim 1.

28. An article comprising an electronic device containing multiple layers of metalization and an interlevel layer which isolates electronic functions occurring in the metalization layers, the interlevel layer having been formed by the process of claim 16.

* * * * *